United States Patent [19]

Grieve et al.

[11] Patent Number: 4,950,577
[45] Date of Patent: Aug. 21, 1990

[54] PRE-PRESS LIGHT-SENSITIVE COLOR PROOFING ARTICLE INCORPORATING ANTIHALATION LAYER

[75] Inventors: Duncan M. A. Grieve, Saffron Walden; Ronald W. Burrows, Harlow, both of England; John Souter, Plymouth, Minn.

[73] Assignee: Minnesota Mining and Manufacturing Company, St. Paul, Minn.

[21] Appl. No.: 737,810

[22] Filed: May 23, 1985

[30] Foreign Application Priority Data

Jun. 11, 1984 [GB] United Kingdom ............... 8414867

[51] Int. Cl.$^5$ ............... G03C 1/495; G03C 1/52; G03C 1/68; G03C 1/84
[52] U.S. Cl. ............... 430/158; 430/143; 430/157; 430/160; 430/162; 430/165; 430/166; 430/253; 430/257; 430/259; 430/271; 430/273; 430/293; 430/510; 430/512
[58] Field of Search ............... 430/158, 160, 162, 271, 430/510, 512, 156, 157, 165, 166, 253, 257, 259, 273, 293, 143

[56] References Cited

U.S. PATENT DOCUMENTS

| | | | |
|---|---|---|---|
| 2,871,119 | 1/1959 | Weegar et al. | 430/195 |
| 3,069,268 | 12/1962 | Herrick | 430/156 |
| 3,313,626 | 4/1969 | Whitney | 430/156 |
| 3,466,172 | 9/1969 | Skavuiuko | 430/207 |
| 3,671,236 | 6/1973 | VanBensekom | 430/160 |
| 3,721,557 | 3/1973 | Iloue | 430/166 |
| 3,854,950 | 12/1974 | Held | 96/82 |
| 3,882,168 | 5/1975 | Klupfol | 430/526 |
| 4,053,313 | 10/1977 | Fan | 430/293 |
| 4,186,017 | 1/1980 | Palmer | 430/175 |
| 4,260,673 | 4/1981 | Krech | 430/143 |
| 4,268,667 | 5/1981 | Anderson | 430/917 |
| 4,304,839 | 12/1981 | Cohan et al. | 430/271 |
| 4,377,632 | 3/1983 | Pflinston | 430/207 |
| 4,409,316 | 10/1983 | Zeller-Pendrey et al. | 430/263 |
| 4,427,757 | 1/1984 | Beebe et al. | 430/306 |
| 4,472,494 | 9/1984 | Hallman et al. | 430/160 |
| 4,489,154 | 12/1984 | Taylor, Jr. | 430/253 |
| 4,520,093 | 5/1985 | Chambers | 430/293 |
| 4,557,996 | 12/1985 | Aoyama et al. | 430/510 |

FOREIGN PATENT DOCUMENTS 645825 11/1950 United Kingdom ............... 430/176
1385241 2/1975 United Kingdom .

OTHER PUBLICATIONS

Sturge, John M., Ed., *Neblette's Handbook of Photography and Reprography*, 7th Ed., p. 24, 25, 388 and 389, 1977.

Dinaburg, M. S., "Photosensitive Diazo Cpds", Focal Press, 1965, p. 161-171.

*Primary Examiner*—Charles L. Bowers, Jr.
*Attorney, Agent, or Firm*—Donald M. Sell; Walter N. Kirn; Mark A. Litman

[57] ABSTRACT

Presensitized sheets for color proofing comprising a removable carrier sheet bearing a photosensitive medium sensitive to radiation within the wavelength band 325 to 700 nm and comprising photohardenable, photoadherent, photoinsolubilisable or photosolubilisable material, the sheet including a removable antihalation layer which is removed either when stripping the carrier sheet or during subsequent processing. The antihalation dyes may be positioned within a transparent carrier sheet, in a layer on the carrier sheet opposite to the photosensitive medium or in a layer positioned between the carrier sheet and light-sensitive medium.

16 Claims, 7 Drawing Sheets

REPRESENTATIVE SPECTRUM OF DYE I

FIG.I

REPRESENTATIVE SPECTRUM OF DYE 2

REPRESENTATIVE SPECTRUM OF: —— DYE 2 + DYE 4 COMBINATION
                           -- DYE 3 + DYE 5 COMBINATION

PRE-PRESS LIGHT-SENSITIVE COLOR PROOFING ARTICLE INCORPORATING ANTIHALATION LAYER

TECHNICAL FIELD

This invention relates to colour proofing systems and in particular to proofing sheets incorporating independent antihalation layers for use therein.

BACKGROUND OF THE ART

In printing pictorial matter, whether by lithography, letterpress or gravure, the halftone process is used, wherein the actual printing image is composed of thousands of minute dots per square inch of a single colour ink of varied dot size or ink density. What the naked eye sees as shading in half-tone prints is actually a controlled variation in size of dots relative to the unprinted areas between the dots or a controlled variation in the ink density of the dots. In black and white pictorial matter the dots are printed in black ink only. Full colour reproductions, however, are necessarily printed in each of three colours, cyan, magenta and yellow (known as "three colour process"), or in these same colours with the addition of black ("four colour process"). For each colour a separate printing plate is made. In order to make the three or four printing plates, the original colour picture or photograph is "separated" photographically or by laser scanner, wit the use of filters, masks, etc., into a set of three or four half-tone negatives or positive transparencies, each representing one of the colours, and containing, dot for dot, the amount of that colour which must be printed in order for composite three or four printed colours to produce the desired total colour print.

The preparation of the colour-separation negative or positive films from colour transparencies is an art and requires considerable skill in handling the many variables to produce a desired result. Often trial and error is involved requiring correction or replacement of one or more of the negatives or positives. Unless some reliable system is available to "proof" the colour separated films, the printing press must be set up and copy printed just to secure preliminary proofs. This is time consuming and expensive.

An example of a negative pre-press proofing system is disclosed in U.S. Pat. Specification No. 3 671 236. This proofing system is commercially available from Minnesota Mining and Manufacturing Company under the trade mark Matchprint. The proofing sheets consist of a carrier sheet provided with a release surface, which may either be a smooth surface of the carrier itself, or a surface coating thereon. Overlying the surface and in intimate clinging engagement therewith, but not adhesively bonded thereto, is a colour coating formed, for example, of a pigmented organophilic water-insoluble solvent-softenable resinous polymer. Coated over and in contact with the colour-coating is a light-sensitive diazo resin layer. The colour coating and light-sensitive layer are intimately associated and adherently bonded together (and in certain constructions can actually be combined to a single layer). The light-sensitive layer is rendered insoluble on exposure. A solution which softens and/or partially dissolves the colour coating is thereafter used to remove the unexposed areas.

Overlying the light-sensitive layer is a continuous solvent-resistant resinous protective film or layer to the exposed surface of which is applied a very thin layer of adhesive, e.g. pressure-sensitive adhesive The outer pressure-sensitive surface of the adhesive can be protected from contamination by dirt or grease, and from adhering to an adjacent sheet in a pile by a protective release liner.

In use the protective liner is first stripped from the adhesive surface and the entire structure is laminated, for example, by rolling, onto a substrate, e.g. white paper. Thereafter, the carrier sheet is stripped from the structure, the bond to the paper and the adhesion between the several layers being greater than the non-adhesive clinging engagement between the carrier sheet and the colour coating. Following the removal of the carrier, the remaining structure, now bonded to the substrate, is exposed to light through the appropriate colour-separation negative corresponding to the colour of the coating. In the light struck areas, the light passes through the colour coating (which is transparent thereto) and exposes and insolubilises the light-sensitive material. A firm bond between the light-reacted material and the under-and over-lapping coatings occurs. The non-exposed areas remain light-sensitive.

Thereafter the sheet is processed with processing solvent selected with respect to the particular material of which the layer is composed (and which contains a solvent for the unexposed diazo) to develop the image, e.g. aqueous alcohol. The colour coating and the sensitiser in the non-light struck areas are removed, leaving the colour image in areas anchored to the underlying layer by the light-reacted diazo in exposure areas. The protective layer serves as a barrier which protects the substrate (and adhesive) from solutions used during the processing.

Following the above described photomechanical production of the first colour image on the substrate, for example cyan, similar sheets but containing the yellow, magenta and black colour coatings are successively applied and the images produced over the structure to yield a four-colour proof.

U.S. Pat. Specification No. 4 260 673 discloses a positive pre-press proofing system which is commercially available from Minnesota Mining and Manufacturing Company under the trade mark Matchprint. These colour proofing sheets consist of a carrier sheet having a smooth release surface; a colour coating of a diazo oxide and a pigmented-resin compound in clinging engagement with but not adhesively bonded to said release surface of said carrier sheet; a binder layer comprising a mixture or reaction product of a resin and a diazo oxide bonded to the surface of said colour coating; said binder layer being free of colour pigment; and said colour coating and said binder layer being solubilisable in a solvent developing medium upon exposure to actinic radiation but not solubilisable in the developing medium prior to exposure to actinic radiation; and a clear barrier layer firmly attached to said binder layer, said barrier layer being insoluble in said solvent development medium.

In order to obtain a multi-coloured colour proofing sheet on one substrate, the barrier layer of a first presensitised sheet of the aforementioned construction is bonded to a substrate and the carrier sheet removed. The substrate with the presensitised proofing sheet bonded thereto is then exposed to actinic radiation through a colour separation positive corresponding to the pigment of the colour coating. The exposed diazo oxide and resin mixture in the binder layer and the colour coating is rendered soluble to a solvent developing medium to create a latent image.

The latent image may then be developed with a solvent developing medium, e.g. an aqueous alkaline medium, preferably sodium hydroxide solution, whereby the exposed diazo oxide and resin mixture in the binder layer and associated colour coating is removed leaving the unexposed diazo oxide and resin. By this removal of the exposed binder layer, the pigment normally associated with causing background discolouration which would have remained bonded to the clear barrier layer is removed.

The aforementioned process is repeated in sequence and in register so that the composite proof contains coloured layers representing the magenta, cyan, yellow and black contributions of the original subject matter.

A modified positive-acting pre-press proofing system is disclosed in European Patent Specification No. 0115899A. This proofing system may be utilised in a similar manner to that disclosed in United States Patent Specification No. 4 260 673 but the photosensitive proofing sheets normally comprise three layers and do not require the presence of a barrier layer. In particular, the positive-acting colour proofing sheet comprises a strippable carrier layer optionally having a release coating on one face thereof upon which is coated a first layer of a base-soluble organic polymeric binder layer having a diazo oxide compound or diazo oxide pendant group on the polymer binder present as at least 15 percent by weight of the binder and sufficient colourant to provide a transmission optical density of at least 1.0, and a thermal adhesive second layer comprising a thermally softenable polymeric adhesive layer, the first layer having at least a substantially polar solvent system with less than 20 percent by volume of all solvents of a non-polar solvent, and the second layer having at least a substantially non-polar solvent system with less than 20 percent by volume of all solvents of a polar solvent.

The photosensitive layer comprises a base soluble organic polymeric resin binder having an o-quinone diazide or other positive-activing diazo oxide mixed with, dissolved in, or pendant to the binder. The layer also contains colourant such as a pigment or dye. The diazo oxide must be soluble or otherwise present in amounts of at least 15% by weight in the organic polymeric resin binder. Preferred polymers for this layer are phenolic resins including both resols and novolaks. Base soluble acrylic resins are also useful. The solvent system used during the coating of the photosensitive layer (and the other layers) can have a dramatic effect. Polar solvents, or at least substantially polar solvent mixtures should be used in the coating of this layer. Examples of useful polar solvents include ketones (methyl ethyl ketone, methyl isobutyl ketone, etc.), alcohols or ethers (glycol monomethyl ether, ethoxy ethyl acetate), halogenated hydrocarbons (trichloroethane, etc.), esters (ethyl or butyl acetate), and mixtures of those polar solvents, together or with small amounts (less than 20% by volume, preferably less than 10% by volume) of non-polar solvents such as intermediate length hydrocarbons (pentane, hexane, heptane, octane, etc.). These mixtures of small amounts of non-polar solvents and polar solvents constitute the substantially polar solvent mixtures referred to above.

The base-soluble organic polymeric binder (i.e. soluble or reasily dispersible in aqueous alkaline solution of pH 13) for the photosensitive layer, as indicated above, is preferably a phenolic resin. Other polymeric materials (such as Butvar resin to disperse to hold the colourant) may be dissolved or mixed with that primary resin binder constituent. Epoxy resin may also be mixed or dissolved with the binder to adjust physical properties. Furthermore, crosslinked epoxy or polyurethane resin may be added as may polyisocyanates (or other epoxy resin crosslinking agents) and monoisocyanates to react with the phenolic resin or other polymer constituents.

The thermal adhesive layer comprises an organic polymeric, thermoplastic binder which is not developed (dissolved or softened so as to be readily removed by hand-rubbing with a developer pad) in an aqueous, alkaline solution of pH 13. Any thermoplastic resin softenable at a temperature of less than 200° C., preferably at less than 175° C. and most preferably at a temperature less than 160° C. (with a preferred range between 100° and 160° C.) is useful as the binder component of this layer if it is not soluble in an aqueous alkaline developer. Preferred polymers are not tacky at 20° C. and include, for example, polyenes (styrene, butadiene, acrylonitrile polymers, copolymers and terpolymers), acrylics (e.g. methylmethacrylate, n-butyl acrylate, copolymers thereof, etc.), etc. These polymers are coated out in a solvent which is not completely miscible (and preferably immiscible) in the coating of the photosensitive layer and is preferably a non-polar solvent or at least substantially non-polar solvent. Solvents such as non-polar aromatic hydrocarbons (toluene, benzene and the like), and aliphatic hydrocarbons (e.g. intermediate length hydrocarbons such as pentane, hexane, heptane, octane, etc.) are particularly preferred. To the extent that any non-polar solvents are used in coating the photosensitive layer with substantially polar solvent mixtures, the non-polar solvents used in the coating of the thermal adhesive layer may be different from the non-polar solvent in the photosensitive layer. Substantially non-polar solvents, as the term is used herein allows for less than 20% by volume of a compatible polar solvent and preferably less than 10%.

U.S. Pat. Specification No. 3 649 268 discloses an alternative colour proofing system which is commercially available from E.I. du Pont de Nemours and Company under the trade name Cromalin Positive Proofing material. In this process an element having a removable support and a photohardenable layer is laminated to a suitable receptor, imagewise exposed through a positive transparency of the original through the support to actinic radiation which selectively raises the stick temperature of those areas receiving the radiation. The support is stripped from the layer and the outer surface of the layer treated (e.g. dusted) with a colourant material which adheres only to the underexposed areas of the layer to read out the image. By repeating the laminating, exposing with separate colour separation records, stripping and treating steps in sequence using different colours, a multicolour image can be obtained.

U.S. Pat. Specification Nos. 4 247 619, 4 489 153 and 4 489 154 disclose a peel-apart colour proofing system. Such a process for preparing a positive overlay comprises:

(a) exposing through a separation positive image a peel-apart photosensitive element comprising in order from top to bottom (1) a strippable cover sheet comprised of a polymeric film which is transparent to actinic radiation, (2) a photoadherent layer containing a colourant and comprising a photohardenable material with ethylenically unsaturated or benzophenone type groups, (3) a nonphotosensitive organic contiguous layer, and (4) a sheet support, wherein after exposure to actinic radiation, the peel force required to remove the cover sheet (1) with the exposed photoadherent layer (2) thereon from the contiguous layer (3) is at least four times the peel force required to remove the cover sheet (1) from an unexposed photoadherent layer (2);

(b) peeling apart the exposed photosensitive element to form two elements (i) cover sheet bearing on its surface coloured exposed image areas, and (ii) sheet support bearing the contiguous layer having on its surface complementary coloured unexposed image areas;

(c) adhering element (ii) to a transparent receptor;

(d) removing the transparent receptor and the coloured unexposed image areas adhered thereto;

(e) repeating steps (a) to (d) at least one time; and (f) overlaying the images in register The process for preparing a positive overlay as described is a dry process, in which liquids need not be used. The photoadherent layer, which is the sole photosensitive layer of the element, is one whose adhesive relationship between the cover sheet and the contiguous layer is altered by exposure to actinic radiation, so that after exposure the exposed areas of the photoadherent layer adhere more strongly to the cover sheet than to the contiguous layer and are removed with the cover sheet while the unexposed areas of the photoadherent layer adhere more strongly to the tacky contiguous layer than to the cover sheet.

In a modified process the photoadherent layer does not contain colourant and the contiguous layer is receptive to colour toner which is applied after peeling apart the element.

In imaging processes, such as those described above, where a sequence of imaged layers is built up, absorption or reflection of actinic radiation by previously imaged layers can produce detrimental effects in the quality and fidelity of reproduction of images, particularly dots, upon imaging exposure. The prior art describes the use of (a) an antihalation layer used below a photohardenable layer or (b) compounds (frequently dyes) used within the photohardenable layer which absorb actinic radiation to prevent halation effects. In spectral regions where a photoinitiator strongly absorbs actinic radiation, the photoinitiator itself functions as an antihalation agent. In spectral regions where a photoinitiator moderately or weakly absorbs, e.g. in the spectral region overlapping near ultraviolet and visible blue, an additional ultraviolet absorbing antihalation agent is needed. Such ultraviolet absorbers, e.g. 2,2'-dihydroxy-4-methoxy-benzophenone, however, of necessity, tend to tint the photohardenable material being protected.

U.S. Pat. Specification No. 3 854 950 discloses a photosensitive element suitable for use in the Cromalin system which comprises a support, and at least one photohardenable layer comprising an intimate mixture of: (a) a photohardenable material, (b) a photoinitiator activatable by actinic radiation which is substantially in the near-UV wavelength spectral region (i.e. about 325 to 425 nm), and (c) a sufficient amount of an ultraviolet radiation absorbing material to reduce the actinic ultraviolet radiation transmitted by the photohardenable layer by more than about 50 percent, the photohardenable layer visually transmitting or reflecting virtually white light. The UV absorbing material must not tint the composition, and if the composition is discoloured due to other components, the ultraviolet radiation absorbing material must brighten the composition so as to render it clear and colourless, whereby the composition will visually transmit or reflect virtually white light.

The Dupont Positive Cromalin materials are generally exposed through a Kokomo filter to cut off emissions above about 425 nm otherwise the exposure time for the photosensitive material becomes so short that it is difficult to control the exposure conditions. Whilst the Kokomo filter absorbs in the near-visible spectrum it does not behave as an antihalation system as it is not in optical contact with the photosensitive element.

The commercially available colour proofing systems employing the lamination techniques described above tend to be sensitive to actinic radiation towards the ultraviolet and in particular within the general wavelength band 325 to 450 nm. These materials are normally exposed to a "photopolymer" source primarily emitting from 320 to 390 nm but also in the visible region of the spectrum up to 450 nm. Other exposure sources which may be employed include "diazo" sources which emit primarily from 385 to 435 nm and also has an emission at about 560 nm and combination photopolymer-diazo sources having primary emissions within the range 325 to 380 nm and also at about 425 nm.

Dyes suppressing halation need to be matched to the light source and the absorbance of the photosensitive layer. It is desirable to provide presensitised sheets for colour proofing which achieve halation suppression in the ultra violet and near visible spectrum.

The antihalation dyes used in the colour proofing systems of the prior art impart a residual stain or tint to the colour proofing sheet and/or do not achieve antihalation suppression throughout the wavelength band 325 to 450 nm. Furthermore, the selection of suitable antihalation dyes has been severely restricted in order to avoid imparting undesirable residual colour to the colour proofing sheets.

The present invention describes constructions of presensitised sheets for use in colour proofing systems incorporating antihalation layers which may readily be completely removed from the colour proofing sheet during processing.

SUMMARY OF THE INVENTION

Therefore according to the present invention there is provided a presensitised sheet for colour proofing comprising a removable carrier sheet bearing on one major surface thereof one or more layers constituting a light-sensitive medium sensitive to radiation within the wavelength band 325 to 700 nm, preferably 325 to 450 nm which medium is photohardenable, photoadherent, photoinsolubilisable, or photosolubilisable, the light-sensitive medium optionally containing a colourant or being intimately associated with a layer of coloured material, the presensitised sheet additionally comprising an antihalation effective amount of one or more antihalation dyes absorbing radiation within the wavelength band 325 to 700 nm, preferably 325 to 450 nm characterised in that the antihalation dye is readily removable and is present:

(i) within the carrier sheet when the carrier sheet is transparent, and/or (ii) in an antihalation layer coated on the side of the carrier sheet opposite to the light sensitive medium when the carrier sheet is transparent, and/or (iii) in an antihalation layer positioned between the carrier sheet and the light sensitive medium, which antihalation layer is distinct from any layer of coloured material intimately associated with the photosensitive layer for formation of a coloured image and is either physically removed from the light-sensitive medium upon removal of the carrier sheet or is removable upon treatment with solvent after removal of the carrier sheet, with the proviso that this antihalation layer is physically removed from the light-sensitive medium upon removal of the carrier sheet when the light-sensitive medium does not contain a colourant or is not intimately associated with a layer of coloured material other than the antihalation layer.

DETAILED DESCRIPTION OF THE INVENTION

Figure 1:
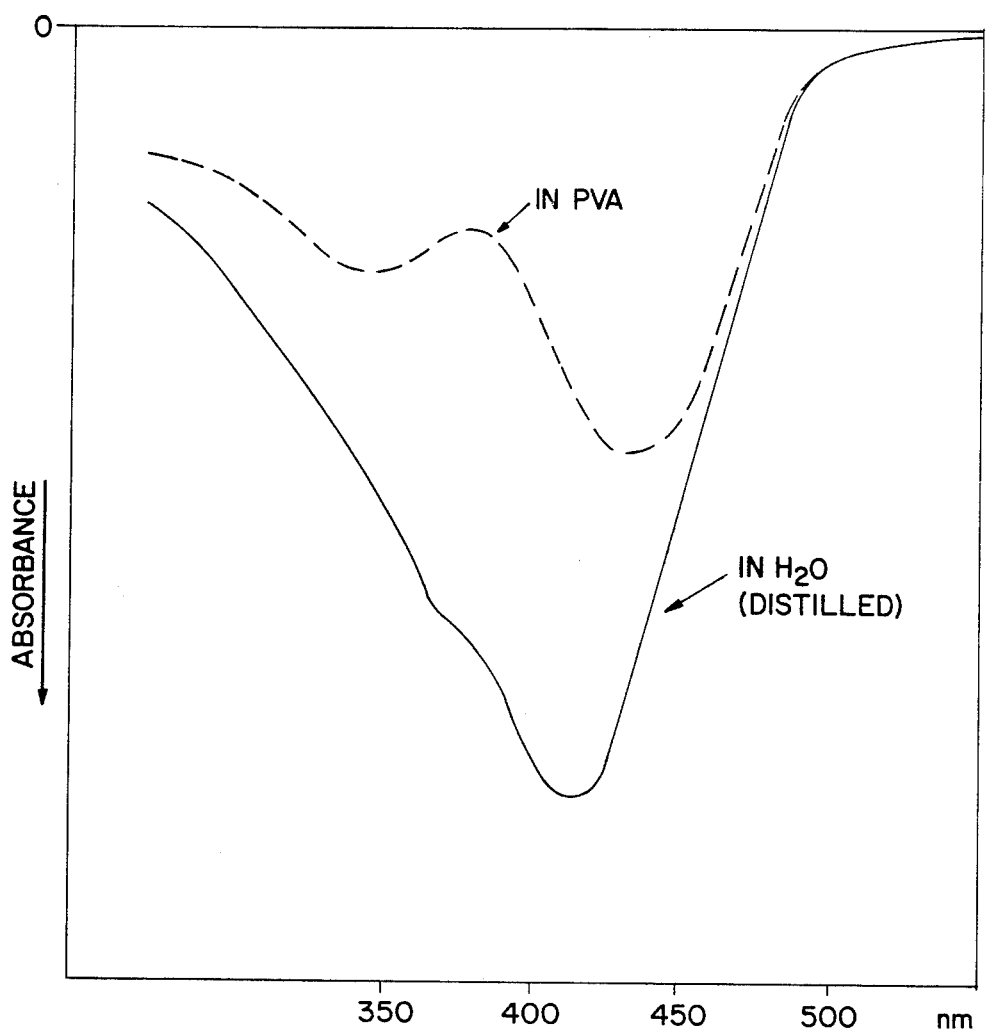

The invention provides presensitised sheets for colour proofing containing halation suppression compounds which are readily removable from the light sensitive imaging media without leaving any residual stain and accordingly the antihalation dyes may be selected from a wide range of compounds regardless of their colour and may only be complementary to that area of the spectrum for which protection is required.

The removable antihalation system in accordance with the invention may be used with a wide variety of colour proofing systems of the type in which the colour proofing sheet is laminated against a receptor. The colour proofing sheet may be exposed through the carrier sheet or the carrier sheet removed prior to exposure, the positioning of the removable antihalation layer be selected accordingly. The systems may be positive or negative acting and examples of suitable colour proofing systems are fully described in United States Patent Specification Nos. 3 649 268, 3 671 236, 50 and 4 260 673.

Heretofore the advantages of utilising a removable antihalation layer in colour proofing systems has not been appreciated and accordingly dyes which have been used for antihalation suppression have been selected from a narrow range of dyes which do not impart residual stain. Photosensitive elements incorporating removable dyes are known and disclosed in British Patent Specification No. 1 385 241. The photosensitive elements disclosed are used for the preparation of photomasks and comprise a photosensitive layer containing a photohardenable material and a layer containing a solvent-soluble binder and a dye or pigment opaque to ultraviolet radiation. After imagewise exposure the element is developed to remove unhardened areas of the photosensitive layer together with the underlying areas of the UV dye-containing layer. Thus, the mask is formed by the UV dye.

When the carrier sheet of the presensitised sheet of the invention is transparent the antihalation dye used in the invention may be present:

(i) within the carrier sheet itself, and/or (ii) in an antihalation layer coated on the opposite side of the carrier sheet to the light sensitive material, and/or (iii) in an antihalation layer positioned between the carrier sheet and the light sensitive medium. In constructions (i) and (ii) the antihalation dye will be removed with the carrier sheet when it is stripped from the laminate after exposure. In construction (iii) the antihalation layer may be removed during stripping of the carrier sheet if the adherence between the light sensitive medium and the antihalation layer is less than that between the antihalation layer and the carrier sheet; alternatively, the antihalation layer may remain above the light sensitive medium after stripping of the carrier sheet in which case the antihalation layer may be removed with a solvent which does not deleteriously affect the image recording of the element, and the carrier sheet may be opaque but is preferably transparent Preferably, the binder and/or antihalation dyes used in such a layer are water-soluble. The antihalation dye-containing layer should be formulated to prevent the dye(s) migrating into the adjacent layer which would affect colour rendition.

In some colour proofing systems the presensitised sheet contains the colourant, e.g. dye or pigment, required in the final image. Generally the colourant is present in the photosensitive medium or the photosensitive medium is initimately associated with a layer of coloured material.

In other colour proofing systems the presensitised sheets do not contain the colourant which is required in the final image; the colourant being applied to the sheet during processing after imagewise exposure. In accordance with the invention antihalation layers used in such systems not containing a colourant must be physically removed from the photosensitive medium when the carrier sheet is stripped.

Preferred constructions in accordance with the invention are based upon the colour proofing systems commercially available under the trade names Negative Matchprint and Matchprint Positive. These systems are described in U.S. Pat. Specification Nos. 671 236, 4 260 673 and U.S. Ser. No. 455,315. As described above, in these systems the carrier sheet is often removed prior to exposure and accordingly the antihalation layer used in the invention is positioned between the carrier sheet and the light sensitive medium and is not stripped from the light sensitive medium when the carrier sheet is removed. Preferably, the antihalation layer contains one or more water-soluble dyes in a water-soluble binder, e.g. poly(vinyl alcohol), poly(vinyl-pyrrolidone) or gelatin thereby allowing the antihalation layer to be removed during the development step in the Matchprint process.

An exemplary construction for use in the negative Matchprint system comprises a carrier sheet having a smooth release surface, an antihalation layer comprising an antihalation effective amount of a dye absorbing within the wavelength band 325 to 450 nm and a binder removable in a solvent developing medium, said antihalation layer being in intimate clinging engagement with but not adhesively bonded to said release surface, a continuous colour coating of pigmented organophilic hydrophobic water-insoluble resinous polymer, which polymer is softenable and/or partially dissolvable in a solvent developing medium, a light sensitive diazo resin soluble in said solvent developing medium directly associated with said colour coating, said direct association being at least one of the following:

(a) the incorporation of said diazo resin in the colour coating to form a single layer, and (b) the incorporation of said diazo resin in a separate but contiguous layer from the colour coating layer.

a continuous, water-insoluble, transparent, colourless barrier layer bonded on one surface over said colour coating and said diazo resin, said barrier layer being insoluble in said solvent developing medium, the diazo resin becoming insolubilised and firmly bonding said colour layer to said barrier layer in the light struck areas upon light exposure of said sheet, the colour layer and diazo resin being readily removable from said barrier layer in areas not light exposed.

These sheets may be used to obtain a full colour proof on a single substrate by a method comprising:

(1) bonding a first presensitised sheet to a substrate by a force greater than said clinging engagement of a colour coating to said carrier sheet, (2) removing said carrier sheet, (3) exposing said presensitised sheet through a colour separation negative corresponding to said colour coating whereby exposed diazo resin is rendered insoluble in said solvent developing medium to create a latent image, (4) developing said image with said solvent developing medium whereby the antihalation layer is removed and unexposed diazo resin and colour coating associated therewith is removed, (5) bonding a second presensitised sheet to the developed first presensitised sheet, (6) repeating steps (2) to (4), and (7) repeating steps (5), and (2) to (4) in that order for further presensitised sheets, each of said colour proofing sheets being of a different colour, whereby there is provided said multi-coloured proofing sheet on one substrate.

An exemplary construction for use in the 4 layer Matchprint Positive system comprises:

a carrier sheet having a smooth release surface;

an antihalation layer comprising an antihalation effective amount of a dye absorbing within the waveband 325 to 450 nm and a binder removable in a solvent developing medium, said antihalation layer being in intimate clinging engagement with but not adhesively bonded to said release surface;

a colour coating of a diazo oxide and a pigmented resin compound;

a binder layer comprising a mixture or reaction product of a resin and a diazo oxide bonded to the surface of said colour coating; said binder layer being free of colour pigment; and said colour coating and said binder layer being removable in a solvent developing medium after exposure to actinic radiation but not solubilisable in the developing medium prior to exposure to actinic radiation; and a clear barrier layer firmly attached to said binder layer, said barrier layer being insoluble in said solvent development medium.

These sheets may be used to obtain a full colour proof on a single substrate by a method comprising:

(a) bonding the barrier layer of a first presensitised sheet to a substrate;

(b) removing said carrier sheet, (c) exposing said presensitised sheet through a colour separation positive corresponding to the pigment of said colour coating to actinic radiation whereby the exposed diazo oxide and resin mixture of said binder and said colour coating is rendered soluble in an alkaline solvent developing medium to create a latent image;

(d) developing said image with an alkaline solvent developing medium whereby exposed diazo oxide and resin mixture in said binder and associated colour coating is removed and unexposed diazo oxide and resin in said binder layer and colour coating remains, (e) boning the barrier layer of an additional presensitised sheet having a different colour pigment in said colour coating to the developed first presensitised sheet;

(f) repeating steps (b) to (d) with a subsequent separation positive being in register with said developed first presensitised sheet; and (g) repeating steps (e) and (b) to (d) in that order with additional presensitised sheets, each of said presensitised sheets being of a different colour, whereby there is provided said multi-coloured proofing sheet on one substrate.

An exemplary construction for use in a three layer Matchprint Positive system comprises:

a carrier sheeting having a smooth release surface, an antihalation layer comprising an antihalation effective amount of dye absorbing within the waveband 325 to 450 nm and a binder removable in a solvent developing medium, said antihalation layer being in an intimate clinging engagement with but not adhesively bonded to said release surface, (a) a layer of a base-soluble organic polymeric binder layer having a diazo oxide compound or diazo oxide pendant group on the polymer binder present as at least 15 percent by weight of the binder and sufficient colourant to provide a transmission optical density of at least 1.0, and (b) a thermal adhesive layer comprising a thermally softenable polymeric adhesive layer, said binder layer having at least a substantially polar solvent system with less than 20 percent by volume of all solvents of a non-polar solvent, and said adhesive layer having at least a substantially non-polar solvent system with less than 20 percent by volume of all solvents of a polar solvent.

The antihalation layer of the invention may also be used in presensitised colour proofing sheets employing a photohardenable layer. The term "photohardenable" refers to the type of photosensitive system disclosed in U.S. Pat. Specification No. 3 649 268 which upon exposure to actinic radiation hardens thereby raising the stick temperature of the exposed areas. The image may be formed by treating with pigment powder which adheres only to the under-exposed areas. A full disclosure of such systems is provided in U.S. Pat. Specification No. 3 649 268 to which reference is made.

The removable antihalation layer of the invention may also be used in "peel-apart" systems of the type disclosed in U.S. Pat. Specification Nos. 4 247 619, 4 489 153 and 4 489 154. Presensitised sheets for use in such a system utilise a photoadherent layer which either contain a colourant or require a toning step after imagewise exposure and stripping the cover from the support.

In accordance with a preferred embodiment of the invention one or two antihalation dyes are present in order to provide halation suppression throughout the wavelength band 350 to 450 nm. In practice, it is convenient to employ two dyes: a yellow dye suppressing visible halation and absorbing wavelengths throughout the range 400 to 450 nm and a ultraviolet absorbing dye suppressing ultraviolet induced halation and absorbing primarily throughout the wavelength range 350 to 400 nm. The ultraviolet absorbing dye may be coloured or colourless. The invention is applicable however to any actinic radiation including laser emission, in the range 325 to 700 nm with a matching antihalation absorption obtained by selection of one or more dyes matching also to sensitivity peaks of the photosensitive layer.

The antihalation layers used in the invention generally have a thickness in the range 0.1 to 200 μm and include sufficient antihalation dye such that the layer has a transmissive optical density in the range 0.01 to 2.0, preferably 0.1 to 1.3, more preferably 0.25 to 0.8 with respect to the intended imaging radiation. The weight ratio of dye(s) to binder in the layer may vary widely but in general dye will be present in an amount of from 0.1 to 20% by weight and the binder will be present in an amount of from 80 to 99.9% by weight assuming no other substances are present. Additives such as surfactants and plasticizers may be included in the layer if necessary but these will not amount in total to more than 10% by weight of the layer.

Those antihalation layers used in the invention which are not removed upon stripping the carrier must be removable upon contact with a suitable solvent, preferably the liquid developer Preferably the binder and/or the antihalation dye is soluble in the solvent, more preferably an aqueous solvent, e.g. aqueous alkaline solution, aqueous alcohol, although it may be sufficient for the binder to be softenable or dispersible in the solvent. A softenable binder refers to a binder which when coated as a 25 μm film and immersed in solvent, preferably water, for 5 minutes at 25° C., will lose its structural integrity and break apart into pieces smaller than 5 mm upon rapid stirring or mild abrasion with a printing plate scrub pad.

The removable antihalation layer in accordance with the invention may be used in conjunction with other antihalation systems. For example, a presensitised sheet for colour proofing in accordance with the invention including a removable yellow antihalation dye may be used in conjunction with a colourless ultraviolet absorbing halation dye which remains in the final colour proof after processing. The colourless ultraviolet absorbing dye may be present in a layer positioned:

(i) between the light sensitive medium and the removable antihalation layer and/or (ii) within the light sensitive medium, and/or (iii) in an antihalation layer coated upon the receptor sheet prior to lamination of the presensitised sheet.

The use of antihalation layers in accordance with the invention provides significant improvement compared with systems not including halation suppression compounds. In particular, the following advantages may be obtained:

1. Increased exposure latitude during imaging giving a wider range of acceptable exposures especially for Negative Matchprint constructions (up to several hundred percent increase).

2. Improved dot percentage resolution giving better reproduction of small dots.

3. Ability to control and reduce optical gain effects especially for positive systems such as Matchprint positive constructions.

4. More accurate rendering of colour gradations used in the printing industry for offset lithography and halftone gravure production not only at the maximum saturated densities but through the tonal range.

5. Wider selection of antihalation dyes may be employed including coloured compounds.

Preferred single layer antihalation systems in accordance with the invention incorporating two removable dyes providing halation suppression throughout the range 350 to 450 nm have revealed the following properties:

1. The increase in latitude referred to above is dependent upon the antihalation dye densities, the higher the densities, the greater the exposure latitude.

2. The ability to reduce halation is dependent on the absorption characteristics of the dyes.

3. The threshold effect noted in standard Matchprint positive (minimum exposure time required before an image is generated) is also observed with the antihalation coated system. This threshold is increased and it is dependent upon the dye densities and spectral characteristics, the higher the density, the higher the threshold, i.e. the system also acts as a filter.

4. The optimum effect for a dye combination is reached at a specific dye reflectance density: this may change with the colour of the proofing construction. Below this density, some halation as opposed to controlled undercutting) is still present, and above this value filtration effects (removal of the controlled undercutting) do not allow optimum reduction in optical gain.

5. Utilising the antihalation system, optical gain can be controlled and predicted (e.g. from approximately 26 to 16% optical gain for 45% dot). It is dependent only upon the exposure value. This control is not possible with standard Matchprint.

6. There appears to be a limit below which the optical gain cannot be reduced. This limit is affected by the maximum optical density of the Matchprint material being used.

Dyes for use in the invention may be selected from a wide range of known dyes. Preferably, the dyes are water-soluble if included in a solubilisable layer.

Suitable ultraviolet absorbing dyes include those referred to in the prior art cited herein. Other ultraviolet absorbing dyes include those of the general formula:

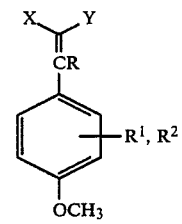

in which:

$R^1$ and $R^2$ are independently selected from hydrogen, OH, alkyl and alkoxy groups of 1 to 4 carbon atoms, and X and Y are independently selected from hydrogen, NC, $CO_2R$, $CONH_2$,

in which R represents an alkyl or alkoxy group of 1 to 4 carbon atoms and Ar represents an aryl group, e.g. phenyl, provided that X and Y are not both hydrogen.

Other dyes for use in the invention are reported in the following Table 1.

TABLE 1

| Dye | Structure |
|---|---|
| 1 | Pyrazolone oxonol dye with two 1-(4-sulfonatophenyl)-3-methyl-5-pyrazolone units linked by =CH–, with 3 (C₅H₆N⊕) counterions |
| 2 | Pyrazolone oxonol dye with two 1-(3-sulfonatophenyl)-3-methyl-5-pyrazolone units linked by =CH–, with 3K⊕ counterions. Antihalofarbstoff Oxonolgelb K commercially available from Riedel-de-Haen A.G. |
| 3, 4 | EtO₂C–C(CN)=CH–CH=C(CN)–CO₂Et with M⊕ counterion; 3, M = NHEt₃⊕; 4, M = K⊕ |
| 5 | 3-methylbenzothiazol-2-ylidene linked to a 4-methylpyridinium via –C(=O)–N⊕H– bridge; C₇H₇SO₃⊖ |
| 6 | Bis(3,5,6-trimethyl-3-methylbenzoxazol-2-yl)methine cyanine; C₇H₇SO₃⊖ |
| 7 | Bis(3-methylbenzoxazol-2-yl)methine cyanine; C₇H₇SO₃⊖ |
| 8 | CH₃O–C₆H₄–CH=C(CN)–CO₂CH₃ |

TABLE 1-continued

| Dye | Structure |
| --- | --- |
| 9 | (structure: pyridine-based dye with I⁻ counterion, methylpyridinium group) |
| 10 | NC-C(=CH-C₆H₄-N(C₆H₄SO₃⁻)₂)-CO₂CH₃, 2K⁺ |
| 11 | (benzothiophene-3-one methylene linked to disulfonated phenyl), 2K⁺ |
| 12 | NC-C(=CH-C₆H₄-OMe)-CN |
| 13 | NC-C(=CH-C₆H₄-OMe)-CONH₂ |
| 14 | (N-ethyl benzothiazole-rhodanine with N-CH₂-CO₂⁻ Et₃NH⁺) |

The invention will now be illustrated by the following Examples.

In a production mode for a Matchprint positive system incorporating a removable antihalation layer in accordance with the invention it is envisaged that the removable antihalation layer comprising a poly(vinyl alcohol) binder will be laid down first on a carrier sheet, e.g. polyester, followed by subsequent layers giving the final Matchprint construction ready for lamination to the receptor. Such a construction is illustrated in Example 3. However, a much simpler approach for initial evaluation of removable antihalation layers is to topcoat the laminated, unexposed MatchPrint receptor bearing the light sensitive medium after stripping of the carrier sheet, with an additional layer comprising the antihalation dye(s) and PVA binder. This method permits extremely fast and facile changes in the PVA binder layer structure but ensures consistent structure/coatings of the other layers. A reduction in the effectiveness of the antihalation layer might be expected but as seen in the following Examples 1 and 2 the system affords marked improvement in image quality.

| Example 1 (a) Preparation of poly(vinyl alcohol) (PVA) solution | |
|---|---|
| BDH Ltd. PVA (MW 14,000) | 72.7% (dry weight) |
| BDH Ltd. PVA (MW 125,000) | 24.3% |
| Antarox CO 630 (nonyl phenol surfactant commercially available from GAF (GB) Ltd.) | 3%. |

The above components were diluted to 10% solids with distilled water.

The PVA solution was used to prepare coating formulations by dissolving the antihalation dyes therein. In cases where dyes dissolved faster in water than in PVA solution, the dye was dissolved in distilled water and added to a more concentrated PVA solution, e.g. 20% solids, to give, after addition of water/dye solution, a final concentration of 10% PVA solids.

(b) Preparation of coating solutions and coating method (i) 20% PVA solution (12.5 ml), Dye No.7 (20 mg) and a solution of Dye No. 5 (90 mg) in 12 ml distilled water were added together, warmed slightly for complete solution, then coated with a No. 1 K-bar (R. K. Chemicals Ltd.) at a 6 micron wet thickness onto a prelaminated Matchprint positive layer over the previous production-applied PVA coating. Immediate drying of this coating with a hot air drier gave a uniform, dyed, PVA topcoat.

A 3M MR527 Positive Proofing Laminator commercially available from Minnesota Mining and Manufacturing Company was used for laminating the colour sheet to the base. Lamination typically occurs at a speed of 81 cm per minute. The Matchprint Positive proofing films were laminated to high quality substrates, e.g. Matchprint Positive base. The bases are generally smooth, photographic grade, titanium dioxide coated papers or transparent, dimensionally stable film such as a polyester film [poly(ethylene terephthalate)]. Base for negative-acting Matchprint films is typically a titanium dioxide containing film or photographic quality paper.

In a manner similar to the above, further coatings were prepared at different coating weights and different coating thicknesses with various dyes in PVA solution all having 10% w/w PVA. The coating thicknesses obtained by different K-bars are as follows:

No. 1 K-bar: 6 μ (0.00025 inches)
No. 2 K-bar: 12 μ (0.0005 inches)
No. 3 K-bar: 24 μ (0.001 inches)
No. 4 K-bar: 36 μ (0.0015 inches).

(ii) Dye 1 (20 mg) in 50 ml PVA solution coated with No. 3 K-bar.
(iii) Dye 2 (46 mg) in 50 ml PVA solution coated with No. 4 K-bar.
(iv) Dye 2 (40 mg) and Dye 4 (40 mg) in 50 ml PVA solution coated with No. 4 K-bar.
(v) Dye 3 (4μmg) and Dye 5 (40 mg) in 50 ml PVA solution coated with No. 3 K-bar.
(vi) Dye 3 (4μmg) and Dye 5 (40 mg) in 50 ml PVA solution coated with No. 4 K-bar.
(vii) Dye 6 (20 mg) and Dye 5 (90 mg) in 25 ml PVA solution coated with No. 4 K-bar.
(viii) Dye 7 (20 mg) and Dye 5 (90 mg) in 25 ml PVA solution coated with No. 1 K-bar.
(ix) Dye 7 (20 mg) and Dye 5 (90 mg) in 25 ml PVA solution coated with No. 2 K-bar.
(x) Dye 7 (20 mg) and Dye 5 (90 mg) in 25 ml PVA solution coated with No. 3 K-bar.

Evaluation of Coated Layers

A. Imaging Techniques

A parker Graphics Ltd. PL5000 U.V. vacuum-frame imaging system, using a metal halide (photo-polymer) imaging source, allowed various exposure levels to be studied.

Exposure for the photopolymer source was controlled and standardised by the following procedure:
(a) The light source was switched on for three consecutive periods prior to imaging (this helps avoid fluctuations in the light source due to heat build-up).
(b) The light-intensity integrator was arranged to record wavelengths between 350 and 400 nm.
(c) Imaging at a given exposure value is reproduced (using the UGRA scale sequentially) across the imageable base. The quality of reproducibility is then easily seen from the developed UGRA scales. All should have the same dot reproduction (The UGRA scale is UGRA-Gretag-Plate Control Wedge PCW). Examples 1 and 2 employed 1976 UGRA scale on which the minimum percentage dot area was 4%. Example 3 employed 1982 UGRA scale on which the minimum percentage dot area was 0.5%.

B. Development

The 3M MR-427 Positive Proofing Processor processes exposed Matchprint Positive sheets in four stages: pre-soak, develop, wash and dry. 3M Positive Proofing Developer is normally used for development within the processor which contains aqueous sodium hydroxide (pH = 12) allowing removal of the PVA/dye layer and exposed coating. Processing speeds were typically 75 cm per minute.

C. Dot Measurement

In this and the following Example 2, it was desired that a thicker composite be made in order to more closely reflect the use in full-colour constructions. Thus, after the cyan (or other) Matchprint composite containing the antihalation dye had been imaged as above a further Matchprint Positive layer was laminated. The polyester carrier sheet was removed and the composite given an overall exposure. The entire, newly applied PVA and photosolubilisable layers were removed by development as above, leaving the adhesive layer upon the originally exposed layer. This lamination —total exposure— development cycle was then repeated twice further.

The re-exposure of the image area led to bleaching of the diazo oxide component leaving the coloured cyan pigment substantially unaffected.

Measurement of dot gain was made using a Gretag Ltd., Type D-162 variable filter densitometer, comparing each percentage dot area to:
(A) the standard 100% dot on UGRA scale,
(B) with a true 4%, 8%, 14%, etc. dot value calibrated in the machine. This instrument measures only species absorbing in the visible.

The following Kodak Wratten filters were employed as appropriate:
29 for magenta
47b for yellow
61 for cyan.

D. Matchprint Colours

In all cases listed here and in the following Examples cyan Matchprint Positive sheets were used as these suffer most from halation, except where otherwise indicated. Two batches of cyan Matchprint Positive sheets were used in this work: these exhibited slightly different maximum optical density (OD) measured by reflectance ranges. Density measurements were made on the base.

To these were applied the coatings indicated in the following Table 2.

TABLE 2

| Antihalation Coating Composition | Dye | Cyan $D_{max}$ |
|---|---|---|
| (ii) | Dye 1 | 1.39–1.44 |
| (iii) | Dye 2 (OD = 0.4) | 1.39–1.44 |
| (iii) | Dye 2 (OD = 0.6) | 1.39–1.44 |
| (iv) | Dye 2 | 1.47–1.50 |
| (v) | Dye 2/Dye 4 | 1.47–1.50 |
| (vi) | Dye 3/Dye 5 | 1.47–1.50 |
| (vii) | Dye 6/Dye 5 | 1.47–1.50 |
| (viii) | Dye 7/Dye 5 | 1.47–1.50 |
| (ix) | Dye 7/Dye 5 | 1.47–1.50 |
| (x) | Dye 7/Dye 5 | 1.47–1.50 |

FIGS. 1 to 4 of the accompanying drawings are representative spectra of the dyes and dye combinations used in the above antihalation coating compositions. Unless otherwise indicated the spectra were obtained by measurement of the dry PVA layers.

It can be seen in FIG. 1 that Dye 1 in solution covers the whole region, i.e. 340 to 480 nm but splits into two peaks when coated in a dry PVA layer. The spectra in FIGS. 2 and 3 are pH sensitive.

Figure 2:
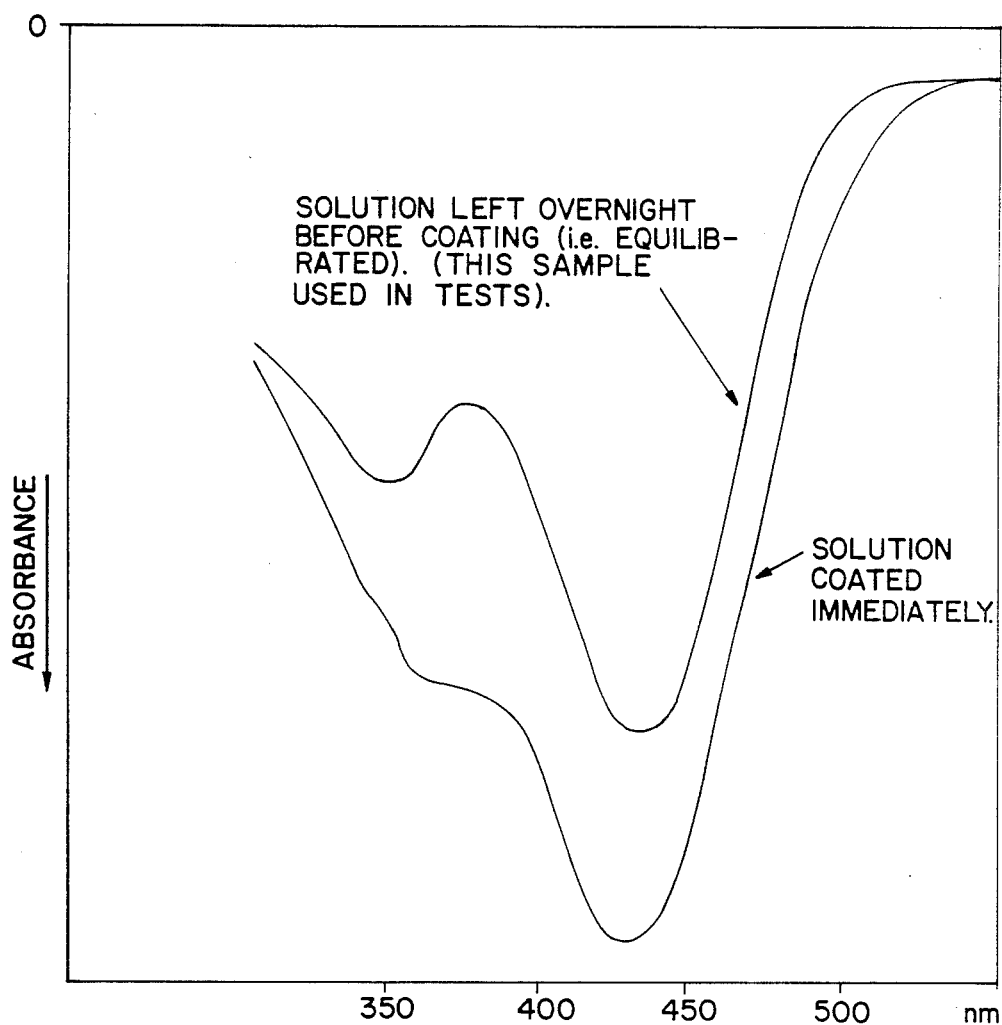
Figure 3:
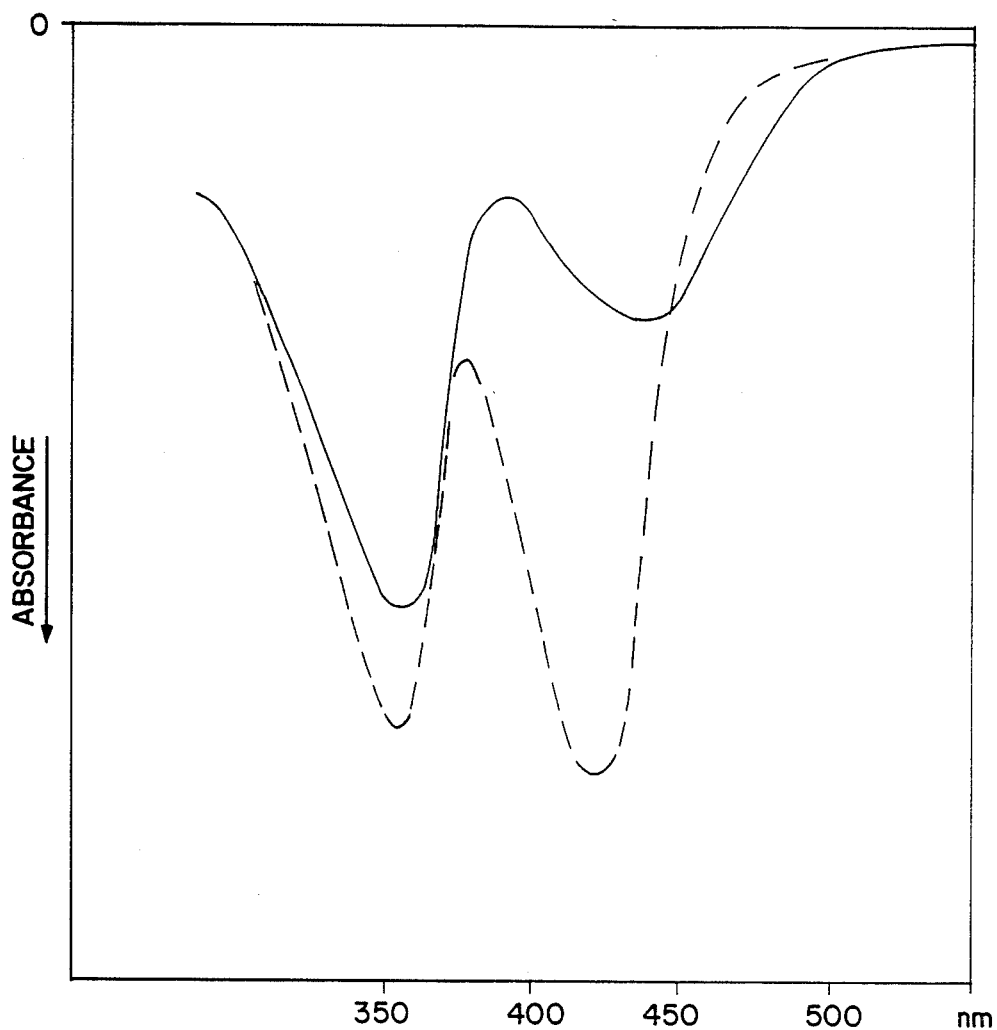

Comparing FIG. 2 with the spectrum of the Dye 2 and Dye 4 combination in FIG. 3, a change in the spectral characteristics of Dye 2 will be noted. This effect may be due in part to dye-dye or dye-polymer interactions.

Figure 4:
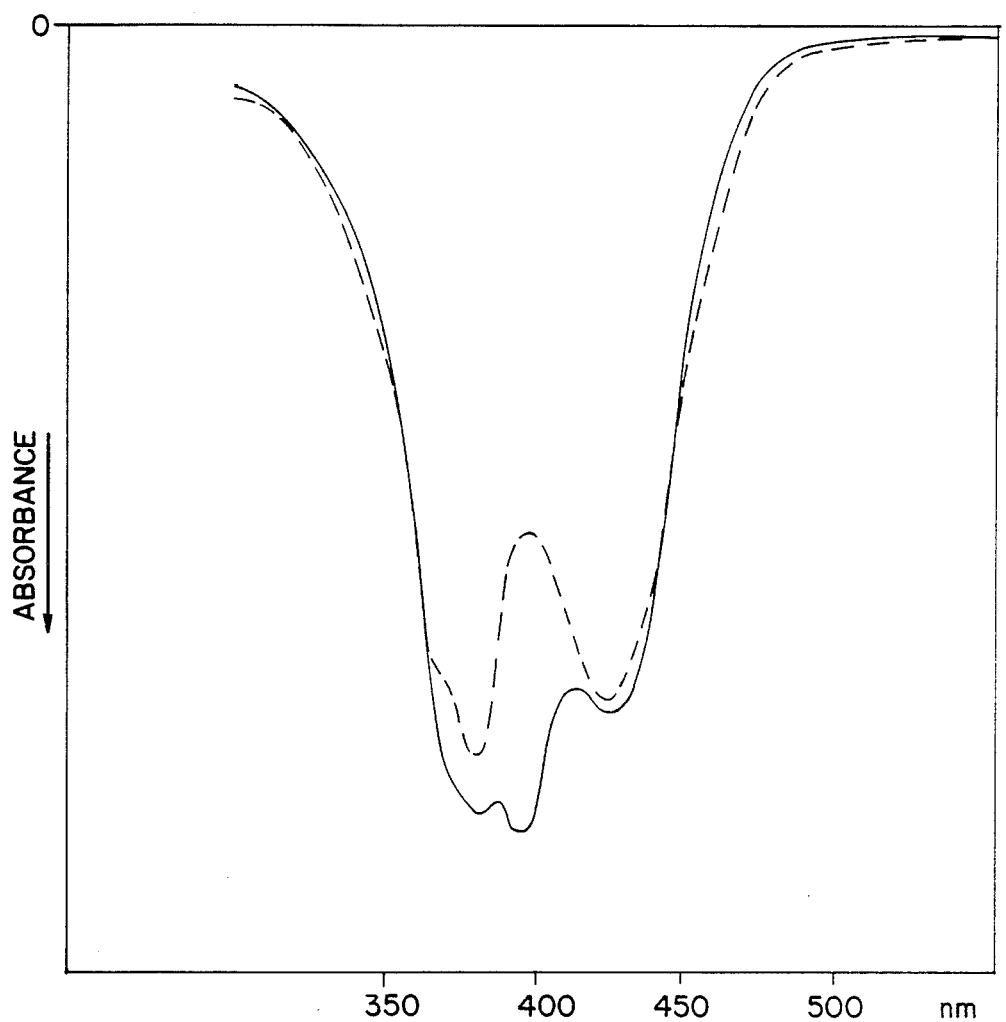

The spectra of the dye combinations shown in FIGS. 3 and 4 vary in their "window" characteristics and band width of wavelength absorption.

Dyes 1 and 2 are variations on the same structure. They differ in position of the sulphonic acid functions and have different counter-ions. Their use as antihalation materials is hampered by their pH sensitivity and subsequent change of spectral characteristics. Dye 2 has been used as an antihalation material in silver halide systems.

Figure 5:
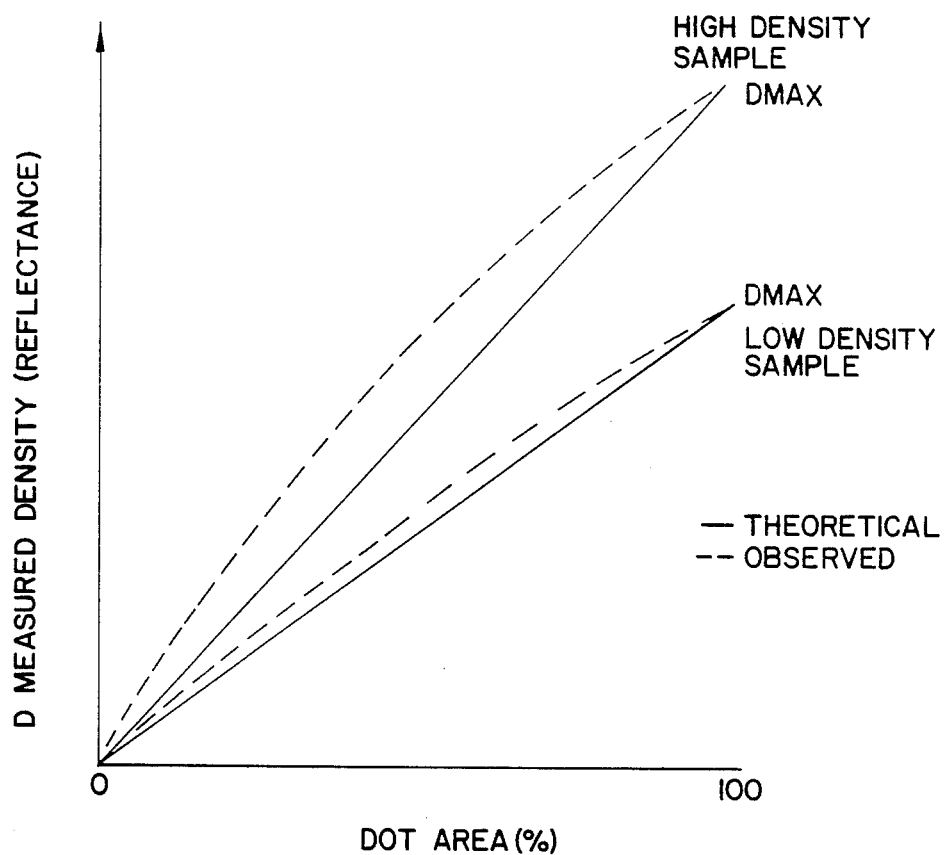

FIG. 5 of the accompanying drawings shows a theoretical plot of density versus dot area likely to be observed for two idealised Matchprint samples (high and low density batches). Superimposed on this are the observed curves. The observed density is higher than the ideal density due to optical gain effects. The observed effects are larger on high density material. It should be noted that variation in $D_{max}$ can change optical gain by 1 to 2%. This study has been carried out on Matchprint Positive sheets having a higher than normal maximum density, the general range being 1.2 to 1.45. Optical gain values are therefore near the extreme which one would expect to obtain.

Figure 6:
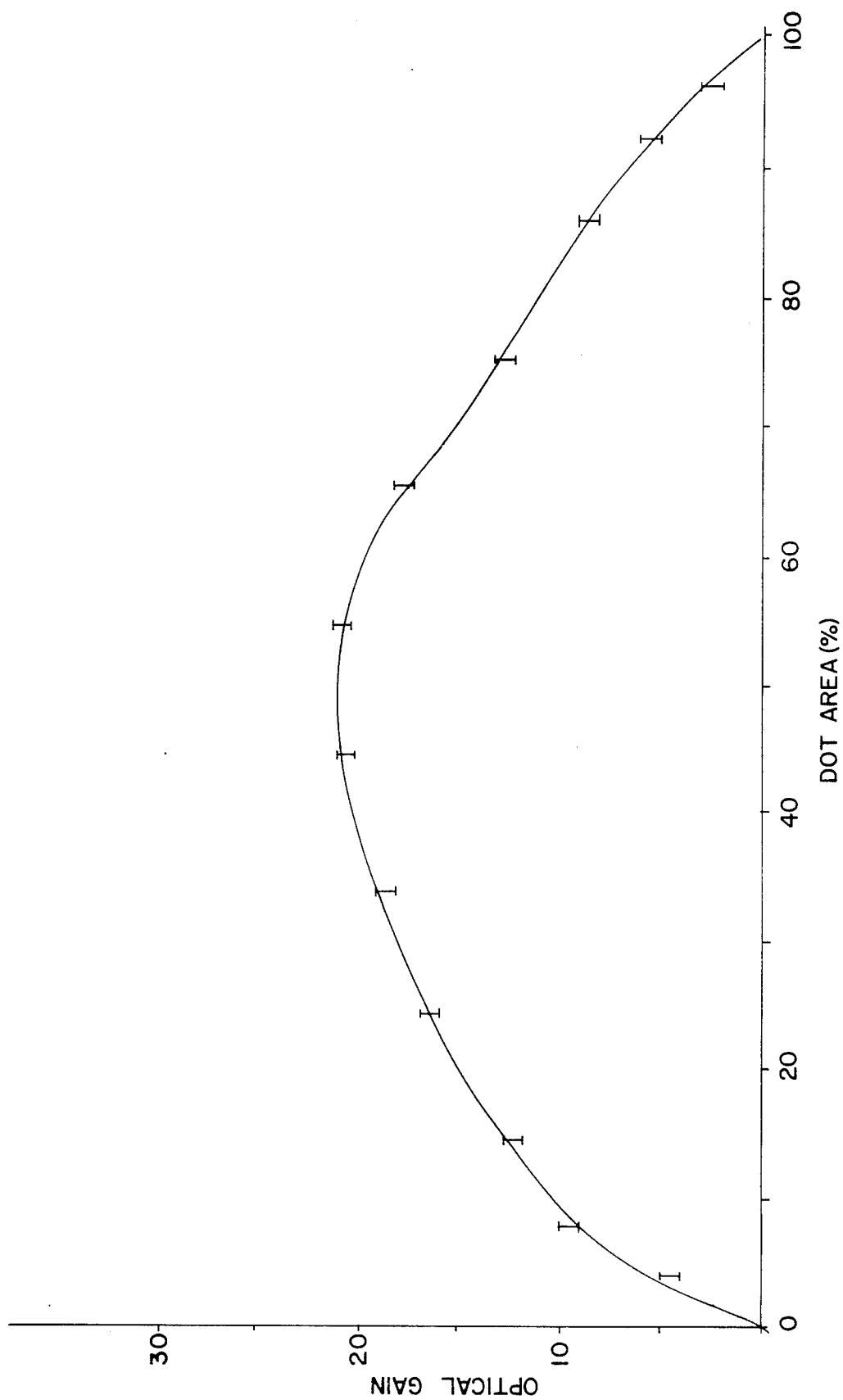

The optical gain profiles were obtained for Matchprint cyan coatings overcoated with the antihalation compositions defined above. FIG. 6 represents a plot of optical gain against dot area for a standard Matchprint cyan layer ($D_{max}$ = 1.40). The maximum exposure acceptable is approximately 6 on the UGRA scale for the standard Matchprint. The following Table 3 reports the optical gain at various dot areas for antihalation coatings over a Matchprint positive cyan layer at different exposure levels. Optical gain profiles similar to that shown in FIG. 6 may be plotted from the figures provided.

TABLE 3

| Sample | Optical Gain at % Dot | | | | |
|---|---|---|---|---|---|
| | 4 | 24 | 45 | 65 | 86 |
| Standard Matchprint Positive (cyan) | 4 | 16 | 21 | 17 | 8 |
| Formulation (ii) | | | | | |
| (140 units) (Exposure ~3) | 3 | 18 | 19 | 17 | 8 |
| (200 units) (Exposure ~5) | 2 | 15 | 17 | 15 | 7 |
| (280 units) (Exposure ~6) | −1 | 12 | 15 | 14 | 7 |
| (380 units) (Exposure ~7) | −3 | 11 | 12 | 13 | 7 |
| Formulation (iii) No. 3 K-bar | | | | | |
| (200 units) (Exposure ~5) | 3 | 18 | 18 | 15 | 8 |
| (280 units) (Exposure ~6) | 2 | 14 | 15 | 13 | 7 |
| (400 units) (Exposure ~7-8) | −3 | 7 | 10 | 12 | 7 |
| Formulation (iii) No. 4 K-bar | | | | | |
| (200 units) (Exposure ~3) | 7 | 20 | 21 | 17 | 10 |
| (280 units) (Exposure ~5) | 5 | 19 | 20 | 16 | 10 |
| (400 units) (Exposure ~6) | −3 | 16 | 17 | 15 | 8 |
| (560 units) (Exposure ~7) | −3 | 11 | 13 | 13 | 7 |
| Formulation (iv) | | | | | |
| (280 units) (Exposure ~2) (Threshold) | 6 | 19 | 20 | 17 | 9 |
| (400 units) (Exposure ~5) | 3 | 16 | 18 | 16 | 8 |
| (540 units) (Exposure ~6) | 1 | 13 | 15 | 14 | 7 |
| (640 units) (Exposure ~7) | −2 | 11 | 13 | 14 | 7 |
| Formulation (v) | | | | | |
| (200 units) (Exposure ~2) (Threshold) | 7 | 21 | 21 | 17 | 10 |
| (280 units) (Exposure ~4) | 6 | 19 | 20 | 17 | 10 |
| (380 units) (Exposure ~5) | 5 | 18 | 19 | 17 | 10 |
| (520 units) (Exposure ~6) | 3 | 15 | 15 | 15 | 10 |
| (640 units) (Exposure ~6) | 1 | 13 | 14 | 14 | 8 |
| Formulation (vi) | | | | | |
| (200 units) (Exposure ~1-2) (Threshold) | 8 | 21 | 22 | 17 | 9 |
| (280 units) (Exposure ~2) | 7 | 21 | 21 | 16 | 9 |
| (400 units) (Exposure ~3-4) | 5 | 20 | 20 | 16 | 9 |
| (560 units) (Exposure ~4) | 5 | 17 | 19 | 16 | 9 |
| (640 units) (Exposure ~5-6) | 4 | 14 | 17 | 17 | 9 |
| (700 units) (Exposure ~7) | 2 | 13 | 14 | 15 | 7 |
| Formulation (vii) | | | | | |
| (650 units) (Exposure ~5) | 3 | 14 | 15 | 15 | 8 |
| (700 units) (Exposure ~6) | 2 | 14 | 14 | 15 | 8 |
| (750 units) (Exposure ~7) | 1 | 11 | 12 | 13 | 7 |

TABLE 3-continued

| Sample | Optical Gain at % Dot | | | | |
|---|---|---|---|---|---|
| | 4 | 24 | 45 | 65 | 86 |
| Formulation (viii) | | | | | |
| (250 units) | 6 | 17 | 20 | 16 | 9 |
| (Exposure ~5-6) | | | | | |
| (350 units) | 4 | 15 | 16 | 14 | 8 |
| (Exposure ~6-7) | | | | | |
| (750 units) | 1 | 11 | 12 | 13 | 7 |
| (Exposure ~7-8) | | | | | |
| Formulation (ix) | | | | | |
| (350 units) | 7 | 18 | 19 | 17 | 8 |
| (Exposure ~5-6) | | | | | |
| (450 units) | 6 | 17 | 18 | 17 | 8 |
| (Exposure ~6) | | | | | |
| (550 units) | 2 | 13 | 14 | 14 | 7 |
| (Exposure ~7) | | | | | |
| Formulation (x) | | | | | |
| (650 units) | 7 | 18 | 19 | 17 | 8 |
| (Exposure ~6) | | | | | |
| (750 units) | 3 | 14 | 15 | 14 | 8 |
| (Exposure ~7) | | | | | |
| (850 units) | 2 | 11 | 14 | 14 | 8 |
| (Exposure ~7-8) | | | | | |

It can be seen that the optical gain profiles that the single Dyes 1 and 2 can reduce halation but are not particularly good. Comparison of coatings of formulations (iii) at No. 3 and 4 K-bar show very little difference in optical gain reduction although the coatings differ in the amount of dye present and optical density. The difference, however, in speed is noticeable; the higher density sample is much slower. The excess dye is acting as a filter with no improvement in image quality.

The two-dye system comprising the combination of Dye 2 and Dye 4 of formulation (iv) is better than Dye 2 alone. However, the shift in spectral absorption (FIG. 3) produces a large "window" at 390 nm, negating some of the expected reduction in optical gain. Photopolymer bulbs have a strong emission at 390 nm. It should be noted that the threshold for imaging has increased. Comparison of coatings of formulations (v) and (vi) similarly show little change in optical gain reduction for the combination of Dyes 3 and 5. Again, the main difference is exposure time. The high density coating is slower. Optical gain can be controlled between approximately 22% and 15% for a 45% dot. The coating of formula (vii) shows the optical gain response for Dye 6 plus Dye 5 at higher exposure values. No optical "window" is apparent in the Dye 6/Dye 5 coating. Optical gain can be reduced to approximately 13 to 14% for a 45% dot. In all the systems it should be noted that a maximum occurs at 55%. Consideration of coatings of formulation (vii) to (x) shows again little effect on optical gain with increasing dye density. Exposure times increase. Optical gain is similar to Dye 6/Dye 5 coatings even although a small "window" is present in the Dye 7/Dye 5 coating (FIG. 4). The optical gain minimum is approximately 12 to 13%. There is a suggestion therefore, of a practical limit in optical gain reduction.

The Dye 7/Dye 5 system is the preferred system, both in reduction of optical gain and ease of access to materials. The sharply absorbing peaks allow low density coatings to be utilised with a subsequent reduction in dye quantities required.

EXAMPLE 2

Dye-containing solution

10% PVA solution (30 g) as in Example 1 incorporating Dye 5 (30 mg) was coated using a No.4 K-bar (36 μwet) onto a prelaminated cyan Matchprint Positive layer. Immediate drying of this coating with heat from a hot air drier gave a uniformly dyed PVA topcoat.

Laminations were carried out on standard Matchprint Positive Base and upon this base bearing an antihalation layer comprising a colourless ultraviolet absorbing dye. The ultraviolet absorbing layer was obtained by coating a the Matchprint base using a No. 4 K-bar with a solution of ultraviolet Dye 8 (90 mg) in butan-2-one (10 ml) with Butvar B76 (500 mg) as binder. The coated sample was dried in an oven at 90° C. for one minute.

Tests were carried out on yellow Dye 5 at dye densities 0.20, 0.20 plus U.V. underlayer and 0.30 plus U.V. underlayer. In all cases a further Matchprint layer has been laminated over the top, then exposed and developed. This procedure was carried out to ensure the final dot gain and overall image approximated that obtained in practical applications where further colours, magenta, yellow and black would be overlayed, imaged, etc.

If a dot is formed and developed as an image and a further layer then laminated, imaged and developed, the dot appears to increase in size due to the additional layer above it. This increase is partly dependent upon the dot profile. The sharper the dot the less the increase.

The following Table 4 reports the value of dot gain at various percentage dot for the above samples at different exposure levels.

TABLE 4

| | Optical Gain at % Dot | | | | |
|---|---|---|---|---|---|
| | 4 | 24 | 45 | 65 | 86 |
| Dye 5 (Density 0.20) | | | | | |
| (Exposure 6) | 3 | 15 | 16 | 13 | 6 |
| Dye 5 (Density 0.20) + Dye 8 Underlayer | | | | | |
| (Exposure 6) | 5 | 14 | 16 | 15 | 8 |
| (Exposure 7) | 1 | 12 | 12 | 12 | 8 |
| Dye 5 (Density 0.30) + Dye 8 Underlayer | | | | | |
| (Exposure 6) | 3 | 14 | 15 | 15 | 8 |
| (Exposure 7) | 2 | 12 | 14 | 13 | 7 |
| (Exposure 8) | 1 | 10 | 12 | 12 | 6 |

Consideration of each of the optical gain values shows the best dot gain obtained for standard Matchprint sample, as compared to the dot gain for a Matchprint system containing one or more antihalation layers. The best example, the Matchprint sample with yellow dye (Dye 5) overcoat at 0.3 reflectance optical density plus U.V. underlayer compared with a standard Matchprint sample, shows a substantial improvement in the reduction of dot gain by allowing increased exposures to be made. While standard Matchprint retains highlight dots, e.g. 4% dots, only up to exposure 6 on the UGRA scale, further increases in exposure up to exposure 8 on the UGRA scale are possible with the antihalation system.

Edge Trace Measurements

"Edge Trace Measurements of Dots" were measured by a computer controlled microdensitomer, on:
(i) Standard cyan Matchprint Positive laminated on Matchprint base exposed at 100 units, developed and a further Matchprint layer laminated over the top, then exposed overall and developed,
(ii) as (i) exposed at 400 units, (iii) as (ii) but additionally comprising an antihalation underlayer of Dye 8 and an antihalation overlayer comprising Dye 5 (OD =0.3) (see Table 4).

Figure 7:
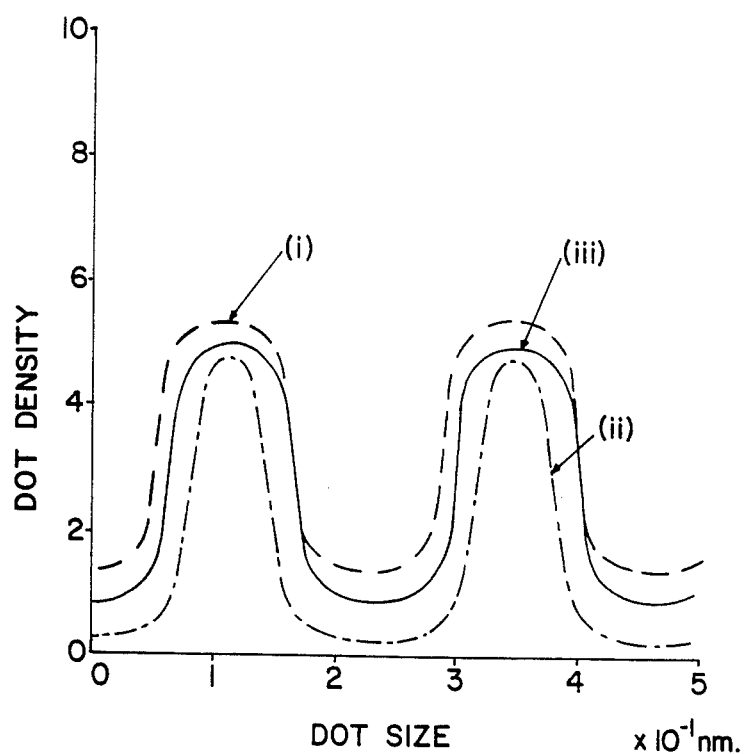

FIG. 7 of the accompanying drawings represents a plot of dot density against dot size for the edge trace measurements.

It can be seen that the dots obtained using the antihalation system are much sharper than those obtained from the standard Matchprint material. Similarly, the apparent dye density between the dots is much less in the antihalation coated system. Even when the antihalation coated system has had approximately 4 times the exposure time (400 units versus 100 units) in the light frame during imaging it does not lose highlight dots by undercutting/halation. What does happen is the removal of dye density between the dots both physically and optically.

Example 3

A solution was prepared by combining the following materials:

| | |
|---|---|
| Dye No. 14 | 0.395 g |
| Triton X-100 (polyethylene glycol alkyl aryl ether) | 0.15 g |
| Gelvatol 20/30 polyvinyl alcohol commercially available from Monsanto | 3.27 g |
| Gelvatol 20/90 polyvinyl alcohol commercially available from Monsanto | 1.09 g |
| deionised water | 190.0 g |
| methanol | 36.0 g |

This release-layer solution was coated onto a 0.002 inch (0.05 mm) polyethylene terephthalate film support at a dry coating weight of 70 to 80 mg/ft$^2$ (750 to 860 mg/m$^2$). The coating was dried at 120° to 200° F. (49° to 93° C.) over three minutes, then overcoated with a cyan, photosensitive layer, suitable for 3M Matchprint Positive proofing sheets. This layer was prepared as follows:

| | |
|---|---|
| Modified Resinox (reaction product of 92% w/w Resinox 7280 (commercially available from Monsanto) and 8% w/w DDI-1410 (diisocyanate commercially available from Henkel) as 29.2% w/w solution in butan-2-one) | 13.6 g |
| Monastral blue pigment BT-297 (commercially available from Du Pont) | 0.51 g |
| Monastral blue pigment BT-284 (commercially available from Du Pont) | 1.19 g |
| Butvar B76 poly(vinyl butyral) | 0.43 g |

After complete milling, a further quantity of modified Resinox solution (1360 g) was added to give a resulting Solution A. The final coating solution was later prepared as follows:

| | |
|---|---|
| Solution A (adjusted to 31.15% w/w solids with butan-2-one) | 13.35 g |
| Benzophenone bis-diazo oxide | 1.26 g |
| Butan-2-one | 15.80 g |

This solution was coated onto the above dye release-layer and dried at 120° to 190° F. (49° to 88° C.) over 2 minutes, so that a transmitted optical density of 1.1 (red filter on Gretag densitometer) was obtained.

Finally, an adhesive solution consisting of 0.85 g Pliolite S-5-A styrene-butadiene copolymer (commercially available from Goodyear) and 9.15 g toluene, was coated directly on top of the colour layer and dried at 190° F. (88° C.) for 2 minutes, to a coating weight of 500 mg/ft$^2$ (5400 mg/m$^2$). This product is referred to hereafter as Coating A.

A "control" coating of standard Matchprint Positive was prepared identically as above, except that a release coat solution containing no yellow dye was used:

| | |
|---|---|
| Triton X-100 | 0.15 g |
| Gelvatol 20/30 | 3.27 g |
| Gelvatol 20/90 | 1.09 g |
| deionised water | 190.0 g |

This product is referred to hereafter as Coating B.

Exposures were carried out using a 5 KW Diazo Bulb at a distance from 30 inches from the positive transparency (UGRA scale) and imaging film. Development was performed subsequently with 3M Positive Proofing Developer (aqueous sodium hydroxide) to form the colour image. Exposures are listed in units (approximately 9 units are equivalent to 1 second). All samples are in the third down position, having two layers of Matchprint Positive adhesive on Schoeller Paper Base underneath the imaging material. After exposure and development, a fourth adhesive layer was laminated over all resultant images to simulate dot gains which would actually occur in a four-colour Matchprint Positive proof.

Several exposures were made to illustrate the improved exposure latitude obtained with incorporation of the antihalo layer, at higher dot gain levels.

| | Coating A | | | |
|---|---|---|---|---|
| | Exposure (units) | | | |
| Dot gains at: | 100 | 140 | 200 | 240 |
| 10% dot | 17 | 15 | 15 | 13 |
| 20% dot | 24 | 22 | 21 | 21 |
| 30% dot | 26 | 25 | 24 | 24 |
| 40% dot | 27 | 26 | 26 | 25 |
| 50% dot | 25 | 24 | 24 | 24 |
| 60% dot | 22 | 22 | 20 | 20 |
| 70% dot | 17 | 17 | 16 | 17 |
| 80% dot | 12 | 12 | 12 | 12 |
| 90% dot | 7 | 7 | 7 | 7 |
| UGRA Scale (pos) | 4 micron | 6 micron | 8 micron | 20 micron |
| Smallest dot | 0.5% | 0.5% | 2% | 4% |

| | Coating B | | | |
|---|---|---|---|---|
| | Exposure (units) | | | |
| Dot gains at: | 50 | 70 | 90 | 110 |
| 10% dot | 18 | 15 | 9 | −6 |
| 20% dot | 24 | 22 | 17 | 6 |
| 30% dot | 26 | 25 | 22 | 11 |
| 40% dot | 27 | 26 | 25 | 16 |
| 50% dot | 25 | 24 | 24 | 18 |
| 60% dot | 22 | 21 | 21 | 20 |
| 70% dot | 18 | 17 | 17 | 16 |
| 80% dot | 13 | 12 | 12 | 12 |
| 90% dot | 7 | 6 | 6 | 6 |
| UGRA Scale (pos) | 4 micron | 8 micron | 25 micron | 40 micron |
| Smallest dot | 0.5% | 3% | 10% | 20% |

In contrast, the exposure latitude seen without use of the antihalo layer (Coating B) is clearly not as good, as can be seen by the rapid falloff of dot gain in the 10 to 30% dots and in the dropoff in highlight dot resolution.

Additional exposures were then carried out with Coating B, this time leaving the 0.002 inch (0.05 mm) PET (polyethylene terephthalate) cover sheet on the imaging layer after lamination and placing the positive (UGRA scale) directly on top of it. This allowed for a controlled dot sharpening as shown in the following table.

| Dot gains at: | Exposure (units), through PET cover sheet | | | |
|---|---|---|---|---|
| | 120 | 150 | 180 | 210 |
| 10% dot | 15 | 13 | 11 | 8 |
| 20% dot | 22 | 19 | 17 | 15 |
| 30% dot | 24 | 22 | 20 | 18 |
| 40% dot | 25 | 23 | 21 | 19 |
| 50% dot | 24 | 23 | 21 | 19 |
| 60% dot | 22 | 20 | 19 | 17 |
| 70% dot | 17 | 16 | 16 | 15 |
| 80% dot | -12 | 12 | 11 | 11 |
| 90% dot | 7 | 7 | 6 | 6 |
| UGRA Scale (pos) | 12 micron | 15 micron | 20 micron | 20 micron |
| Smallest dot | 2% | 2% | 3% | 3% |

As can be seen from this table, the 40% dots can be sharpened to a dot gain level of 19% while still retaining 3% highlights in the case of material containing the yellow antihalo dye. From the previous table, when material without the antihalo dye was exposed at 70 units, the 40% dots showed a dot gain of 26% while 3% dots were still present. However, when exposure was increased to 90 units, little sharpening of the midtones (40% dot, etc.) was seen although highlight dots smaller than 10% disappeared. This demonstrates that, while cyan Coating A can have its 40% dot sharpened from 27 to 19% gain without major loss in highlight dot rendition, it is not possible to sharpen cyan Coating B's 40% dot below a 26% gain without substantial highlight loss.

This, in addition to improvement in exposure latitude at high dot gain levels, is a major advantage of this invention.

EXAMPLE 4

A cyan Negative Matchprint construction was prepared as in Example 1 of U.S. Pat. Specification No. 3 671 236 except that a thermally activatable poly-N-butyl acrylate was employed. This was applied as a latex solution at a dry coating weight of approximately 1.7 g/m$^2$, similar to the weight of the barrier layer. The exposure source was a 5 Kw diazo bulb position 10 cm from the imageable material.

The following table compares the dot gain and exposure latitude of standard cyan Matchprint Negative/Thermal proofs in proof position to a sample of cyan Matchprint Negative/Thermal containing 8 percent by weight yellow dye No. 14 in the PVA layer.

TABLE

| Sample | Exposure time (secs) | Dot Gain (at 150 lines) 40% | 60% | Exposure latitude (11 steps) | D$_{max}$ |
|---|---|---|---|---|---|
| 1 (with yellow dye) | 15-35 | 22 | 18 | 2.1-4.2 | 1.46 |
| 2 (without yellow dye) | 7-11 | 21 | 18 | 2.5-3.8 | 1.31 |

The dot gain is unaffected and the exposure latitude shows a 62% improvement by inclusion of a yellow dye and the PVA layer.

EXAMPLE 5

This Example utilises a colour proofing system sold under the trade name Cromalin Positive Proofing material which is commercially available from DuPont de Nemours. This colour proofing system is the subject of U.S. Pat. Specification Nos. 3 649 268 and 3 854 950.

The Cromalin presensitised sheet was laminated in an automatic processor onto the standard support commercially available under the trade name Kromekote. The support contains an optical brightener as an antihalation suppressant.

A sample of the laminated structure was coated over the polyester cover sheet with the following formulation to provide an antihalation layer having an optical density by transmission of 0.5:

| | |
|---|---|
| dispersed yellow dye | 60 g |
| Butvar 76 (polyvinylbutyral resin) | 108 g |
| Modified Resinox (reaction product of Resinox 7280 (commercially available from Monsanto) and DDI-1410 di-isocyanate (commercially available from Henkel) 29.2% solids in butan-2-one) | 1440 g |
| Butan-2-one | 1720 g |
| Structure of yellow dye: | |

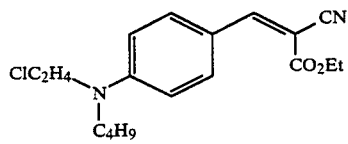

Using the 3M Matchprint Colour Control Element strip which contains line resolution elements, the lines being graded in thickness between 6 and 18 microns, a number of exposures were made. These were made using a photopolymer bulb with a Kokomo filter commercially available from Pako which cuts off emissions above about 425 nm. In the absence of the filter the exposure times of the commercially available material would be unexpectedly short. After exposure the cover sheet polyester layer was then removed and the tacky areas were toned with cyan powder in an automatic processor.

After toning the image was laminated again with another Cromalin photopolymer layer. This was given an overall exposure in order to harden the photosensitive layer and then the polyester cover sheet was removed. The purpose of this new photohardened layer is to act as a protective layer.

The sheet was then evaluated for best line per resolution, for the maintenance of highlight dots and for dot gain at 40 and 80% dot. The results are given below:

| Exposure time in seconds | Width of lowest lines resolved | Smallest acceptable dot size | Dot Gain at 40% dot |
|---|---|---|---|
| 6 | 15 microns | 2% | +11 |
| 12 | 18 microns | 4% | +7 |
| 24 | over 18 microns | 40% | −32 |

A similar series of measurements was made without the antihalation layer and very similar results were obtained. Thus, in the presence of the Kokomo filter there appears to be no effect.

A further evaluation was undertaken with the Kokomo filter being removed. The optical density of the yellow dye layer was between 0.4 and 0.6 (by transmission). It was found that exposure times were of the order of 1 second and this was too short to be usefully controllable.

A third evaluation was undertaken with the Kokomo filter being absent but a higher optical density dye solution being employed. The optical density of this layer was 1.5 by transmission. Processing was undertaken as in former Examples and the results obtained are reported below.

| Exposure time in seconds | Width of lowest lines resolved | Smallest acceptable dot size | Dot Gain at 40% dot |
|---|---|---|---|
| 6 | 6 microns | 2% | +6 |
| 12 | 12 microns | 3% | +4 |
| 24 | 15 microns | 3% | +2 |

It will be seen from the results that smaller lines may be resolved and that there is a reduction in the dot gain. Thus, better resolution and dot reproduction fidelity are being achieved. A significant improvement to the performance of the Cromalin material has been demonstrated.

We claim:

1. A presensitised sheet for colour proofing comprising a removable carrier sheet bearing on one major surface thereof one or more layers constituting a light-sensitive medium sensitive to radiation within the wavelength band 325 to 700 nm, which medium is photohardenable, photoadherent, photoinsolubilisable, or photosolubilisable, the presensitised sheet additionally comprising an antihalation effective amount of one or more antihalation dyes absorbing radiation within the wavelength band 325 to 700 nm, characterised in that the antihalation dye is readily removable and is present:
   (i) within the carrier sheet when the carrier sheet is transparent, and/or
   (ii) in an antihalation layer positioned between the carrier sheet and the light sensitive medium, which antihalation layer is distinct from any layer of coloured material intimately associated with the photosensitive layer for formation of a coloured image and is either physically removed from the light-sensitive medium upon removal of the carrier sheet or is removable upon treatment with solvent after removal of the carrier sheet, with the proviso that this antihalation layer is physically removable from the light-sensitive medium upon removal of the carrier sheet either by the removal of the carrier sheet or by solubilisation of the antihalation layer in a solvent selected from the group consisting of aqueous alkaline solutions and water.

2. A presensitised sheet as claimed in claim 1, characterised in that the antihalation layer has an optical density by transmission in the range 0.1 to 1.3.

3. A presensitised sheet as claimed in claim 2, characterised in that the light sensitive medium is photoinsolubilisable or photosolubilisable and contains a colourant or is intimately associated with a layer of coloured material.

4. A presensitised sheet as claimed in claim 2 comprising a carrier sheet having a smooth release surface,
an antihalation layer comprising an antihalation effective amount of a dye absorbing within the wavelength band 325 to 450 nm and a binder softenable or soluble in a solvent developing medium, said antihalation layer being in intimate clinging engagement with but not adhesively bonded to said release surface,
a continuous colour coating of pigmented organophilic hydrophobic water-insoluble resinous polymer, softenable and/or partially dissolvable in a solvent developing medium,
a light sensitive diazo resin soluble in said solvent developing medium directly associated with said colour coating, said direct association being at least one of the following:
   (a) the incorporation of said diazo resin in the colour coating to form a single layer, and
   (b) the incorporation of said diazo resin in a separate but contiguous layer from the colour coating layer,
a continuous, water-insoluble, transparent, colourless barrier layer bonded on one surface over said colour coating and said diazo resin, said barrier layer being insoluble in said solvent developing medium,
the diazo resin becoming insolubilised and firmly bonding said colour layer to said barrier layer in the light struck areas upon light exposure of said sheet, the colour layer and diazo resin being readily removable from said barrier layer in areas not light exposed.

5. A presensitised sheet as claimed in claim 2 which comprises:
   a carrier sheet having a smooth release surface;
   an antihalation layer comprising an antihalation effective amount of a dye absorbing within the waveband 325 to 450 nm and a binder removable in a solvent developing medium, said antihalation layer being in intimate clinging engagement with but not adhesively bonded to said release surface;
   a colour coating of a diazo oxide and a pigmented resin compound;
   a binder layer comprising a mixture or reaction product of a resin and a diazo oxide bonded to the surface of said colour coating; said binder layer being free of colour pigment; and said colour coating and said binder layer being solubilisable in a solvent developing medium upon exposure to actinic radiation but not solubilisable in the developing medium prior to exposure to actinic radiation; and
   a clear barrier layer firmly attached to said binder layer, said barrier layer being insoluble in said solvent development medium.

6. A presensitised sheet as claimed in claim 1 which comprises:
   a carrier sheet having a smooth release surface;
   an antihalation layer comprising an antihalation effective amount of a dye absorbing within the waveband 325 to 450 nm and a binder removable in a solvent developing medium, said antihalation layer being in intimate clinging engagement with but not adhesively bonded to said release surface;
   a layer of a base-soluble organic polymeric binder layer having a diazo oxide compound or diazo oxide pendant group on the polymer binder present as at least 15 percent by weight of the binder and sufficient colourant to provide a transmission optical density of at least 1.0, and a thermal adhesive layer comprising a thermally softenable polymeric adhesive layer, the binder layer having at least a substantially polar solvent system with less than 20 percent by volume of all solvents of a non-polar solvent, and the adhesive layer having at least a substantially non-polar solvent system with less than 20 percent by volume of all solvents of a polar solvent.

7. A presensitised sheet as claimed in any claim 1 characterised in that the coloured material forming the image is selected from cyan, magenta and yellow materials.

8. A presensitised sheet as claimed in claim 2 characterised in that the removable antihalation layer comprises a yellow dye and/or an ultraviolet absorbing dye.

9. A presensitised sheet as claimed in claim 1 characterised in that the light sensitive medium is photohardenable.

10. A presensitised sheet as claimed in claim 1 characterised in that the light-sensitive medium is photoadherent and the sheet constitutes a peel-apart system.

11. The presensitized sheet of claim 1 characterized in that the light-sensitive medium comprises:
    (a) a binder layer comprising a mixture of a resin and a diazo oxide or a reaction product of a resin and a diazo oxide, said binder layer being free of color pigment, and
    (b) a color coating of a diazo oxide and a pigmented resin,
binder layer being removable in said solvent for said antihalation layer after exposure to actinic radiation, but not solubilizable in said solvent prior to exposure to actinic radiation.

12. The presensitized sheet of claim 2 characterized in that the light-sensitive medium comprises:
    (a) a binder layer comprising a mixture of a resin and a diazo oxide or a reaction product of a resin and a diazo oxide, said binder layer being free of color pigment, and
    (b) a color coating of a diazo oxide and a pigmented resin,
said binder layer being removable in said solvent for said antihalation layer after exposure to actinic radiation, but not solubilizable in said solvent prior to exposure to actinic radiation.

13. The presensitized sheet of claim 1 characterized in that the light-sensitive medium comprises a photohardenable layer the stick temperature of which is raised by exposure to actinic radiation which hardens the exposed areas.

14. The presensitized sheet of claim 2 characterized in that the light-sensitive comprises a photohardenable layer the stick temperature of which is raised by exposure to actinic radiation which hardens the exposed areas.

15. The presensitized sheet of claim 1 in which the light-sensitive medium consists essentially of diazo oxide.

16. The presensitized sheet of claim 4 in which the light-sensitive medium consists essentially of diazo oxide.

* * * * *

UNITED STATES PATENT AND TRADEMARK OFFICE
CERTIFICATE OF CORRECTION

PATENT NO. : 4,950,577

DATED : August 21, 1990

INVENTOR(S) : Grieve, Burrows and Souter

It is certified that error appears in the above-identified patent and that said Letters Patent is hereby corrected as shown below:

Column 7, line 33, "50" should be --3 854 950--.

Column 8, line 29, "671 236," should be -- 3 671 236--.

Column 9, line 65, "boning" should be --bonding--.

Column 17, line 61, "(4μmg)" should be --(40 mg)--.

Column 17, line 63, "(4μmg)" should be --(40 mg)--.

Signed and Sealed this

Nineteenth Day of November, 1991

Attest:

HARRY F. MANBECK, JR.

*Attesting Officer*  *Commissioner of Patents and Trademarks*